(12) United States Patent
Kim et al.

(10) Patent No.: US 7,575,974 B2
(45) Date of Patent: Aug. 18, 2009

(54) METHOD FOR FABRICATING SEMICONDUCTOR DEVICE INCLUDING RECESS GATE

(75) Inventors: Suk-Ki Kim, Ichon (KR); Yong-Tae Cho, Ichon (KR)

(73) Assignee: Hynix Semiconductor Inc., Ichon-shi, Kyoungki-do (KR)

( * ) Notice: Subject to any disclaimer, the term of this patent is extended or adjusted under 35 U.S.C. 154(b) by 0 days.

(21) Appl. No.: 11/768,620

(22) Filed: Jun. 26, 2007

(65) Prior Publication Data

US 2008/0113500 A1    May 15, 2008

(30) Foreign Application Priority Data

Nov. 15, 2006 (KR) .................. 10-2006-0112645

(51) Int. Cl.
 *H01L 21/336* (2006.01)
(52) U.S. Cl. ............... 438/259; 438/270; 438/E21.429; 438/E21.561; 257/330; 257/331
(58) Field of Classification Search ......... 438/259–260, 438/270; 257/330–332
See application file for complete search history.

(56) References Cited

U.S. PATENT DOCUMENTS

| 2003/0122171 | A1* | 7/2003 | Huang ................. 257/296 |
| 2004/0259310 | A1* | 12/2004 | Chang et al. ............. 438/259 |
| 2005/0079661 | A1 | 4/2005 | Cho et al. |
| 2005/0285177 | A1* | 12/2005 | Shone .................. 257/315 |
| 2006/0128130 | A1 | 6/2006 | Jang et al. |
| 2006/0216917 | A1 | 9/2006 | Seo |
| 2006/0289931 | A1* | 12/2006 | Kim et al. .............. 257/330 |
| 2007/0048930 | A1* | 3/2007 | Figura et al. ............. 438/243 |

FOREIGN PATENT DOCUMENTS

| KR | 1020060032028 | 4/2006 |
| KR | 1020060068200 | 6/2006 |

OTHER PUBLICATIONS

Office Action dated Nov. 28, 2008, for Chinese application No. 200710149528.5.

* cited by examiner

*Primary Examiner*—Dung A. Le
(74) *Attorney, Agent, or Firm*—Lowe Hauptman Ham & Berner, LLP

(57) ABSTRACT

A method for fabricating a semiconductor device includes forming a hard mask pattern over a substrate having a field oxide layer, etching the substrate to form a recess by using the hard mask pattern, forming a first conductive layer over the recess and the hard mask pattern, planarizing the first conductive layer, and forming a second conductive layer over the planarized first conductive layer.

20 Claims, 7 Drawing Sheets

METHOD FOR FABRICATING SEMICONDUCTOR DEVICE INCLUDING RECESS GATE

CROSS-REFERENCE TO RELATED APPLICATIONS

The present invention claims priority of Korean patent application number 10-2006-0112645, filed on Nov. 15, 2006, which is incorporated by reference in its entirety.

BACKGROUND OF THE INVENTION

The present invention relates to a method for fabricating a semiconductor device, and more particularly, to a method for fabricating a semiconductor device including a recess gate.

As semiconductor devices become highly-integrated, a cell transistor channel length has decreased and an ion implantation doping concentration of a substrate has increased, resulting in an increased junction leakage induced by an increased electric field. Thus, it has become difficult to secure a refresh characteristic of a device with a typical planar transistor structure.

A recess gate process has been introduced to overcome such a difficulty. The recess gate process includes etching a certain portion of an active region of a substrate such that a gate is formed over a recess. Thus, the cell transistor channel length is increased and the ion implantation doping concentration is decreased, resulting in an improved refresh characteristic. Furthermore, a bulb type recess gate process has been introduced to further increase the channel length by forming a recess in bulb type structure. Thus, the refresh characteristic of the device has been further improved.

FIGS. 1A to 1E illustrate cross-sectional views of a typical method for fabricating a semiconductor device including a recess gate.

Referring to FIG. 1A, field oxide layers 12 are formed in a substrate 11. The field oxide layers 12 define an active region and a field region. An oxide-based hard mask 13 is formed over the substrate 11. The oxide-based hard mask 13 functions as a barrier when etching a subsequent recess. The oxide-based hard mask 13 is used as a hard mask because the oxide-based hard mask 13 reduces damage on the substrate 11. The oxide-based hard mask 13 is formed to a small thickness to minimize a loss of the field oxide layers 12 during a subsequent removal process of the oxide-based hard mask 13. A photoresist pattern 14 defining recess regions is formed over the oxide-based hard mask 13.

Referring to FIG. 1B, the oxide-based hard mask 13 is etched using the photoresist pattern 14 as a mask. Reference denotation 13A refers to an oxide-based hard mask pattern 13A.

Referring to FIG. 1C, the photoresist pattern 14 is removed. The substrate 11 is then etched using the oxide-based hard mask pattern 13A as a barrier to form recesses 15. The recesses 15 may each include a bulb type recess configured with an upper portion having a vertical profile and a bottom portion having a rounded profile. The upper portion having the vertical profile may be referred to as a neck pattern 15A and the bottom portion having the rounded profile may be referred to as a bulb pattern 15B. The oxide-based hard mask pattern 13A functioning as a barrier is often damaged during the etch process for forming the recesses 15. At this time, the field oxide layers 12 including substantially the same material as the oxide-based hard mask pattern 13A are also damaged. Reference numeral 12A refers to remaining field oxide layers 12A.

Referring to FIG. 1D, the oxide-based hard mask pattern 13A is removed using a wet cleaning process. At this time, the remaining field oxide layers 12A including substantially the same material as the oxide-based hard mask pattern 13A are further damaged. Reference numeral 12B refers to residual field oxide layers 12B.

That is, the field oxide layers 12 are excessively damaged two times during the process for forming the recesses 15 shown in FIG. 1C and the removal process of the oxide-based hard mask pattern 13A shown in FIG. 1D because the oxide-based hard mask pattern 13A and the field oxide layers 12 include substantially the same material. The excessive damage of the field oxide layers 12 may cause deteriorated device characteristics. Examples of the deteriorated device characteristics include a leaning event where a passing gate over the residual field oxide layers 12B collapses, reduction in a word line cap value between a gate and a passing gate on an active region, and reduction of a refresh characteristic of a gate on an active region due to polysilicon filled in the damaged portions of the residual field oxide layers 12B by a subsequent gate formation process.

Referring to FIG. 1E, a gate insulation layer (not shown) is formed over the resultant structure. A polysilicon layer 16 for forming gate patterns is formed over the gate insulation layer. At this time, differences in height occur at an upper surface of the polysilicon layer 16 due to the recesses 15 and the damaged portions of the residual field oxide layers 12B. The differences in height may cause a seam in a subsequent metal layer for forming subsequent gate patterns, to be formed over the polysilicon layer 16. Thus, deteriorated device characteristics are generated such as a self-aligned contact (SAC) limitation.

Although not shown, subsequent processes include forming a metal layer and a gate hard mask over the polysilicon layer 16 with the differences in height, and selectively etching the gate hard mask, the metal layer, and the polysilicon layer 16 to form gate patterns.

According to the typical method for fabricating the semiconductor device, the substrate 11 may be prevented from damage when using the oxide-based hard mask pattern 13A as a mask for forming the recesses 15. However, the field oxide layers 12 are excessively damaged during the process for forming the recesses 15 and the removal process of the oxide-based hard mask pattern 13A because the oxide-based hard mask pattern 13A includes substantially the same material as the field oxide layers 12. Thus, the device characteristic is deteriorated. The device characteristics are also deteriorated due to the differences in height at the upper surface of the polysilicon layer 16 for forming the gates, the differences in height generated by the recesses 15 and the damaged residual field oxide layers 12B.

SUMMARY OF THE INVENTION

Embodiments of the present invention are directed to provide a method for fabricating a semiconductor device including a recess gate, which can improve device characteristics by reducing excessive damage of field oxide layers and differences in height over an upper portion of a conductive layer for forming gates during a recess gate formation process.

In accordance with an aspect of the present invention, there is provided a method for fabricating a semiconductor device, including: forming a hard mask pattern over a substrate having a field oxide layer; etching the substrate to form a recess by using the hard mask pattern; forming a first conductive layer over the recess and the hard mask pattern; planarizing the first conductive layer; and forming a second conductive layer over the planarized first conductive layer.

In accordance with another aspect of the present invention, there is provided a method for fabricating a semiconductor device, including: forming a hard mask pattern over a substrate having a field oxide layer; etching the substrate to form a recess by using the hard mask pattern; forming a first conductive layer over the recess and the hard mask pattern; removing a height difference effect generated from the recess and a damaged portion of the field oxide layer by planarizing the first conductive layer; and forming a second conductive layer over the planarized first conductive layer.

DESCRIPTION OF SPECIFIC EMBODIMENTS

Embodiments of the present invention relate to a method for fabricating a semiconductor device including a recess gate.

FIGS. 2A to 2F illustrate cross-sectional views of a method for fabricating a semiconductor device including a recess gate according to an embodiment of the present invention.

Figure 1A:
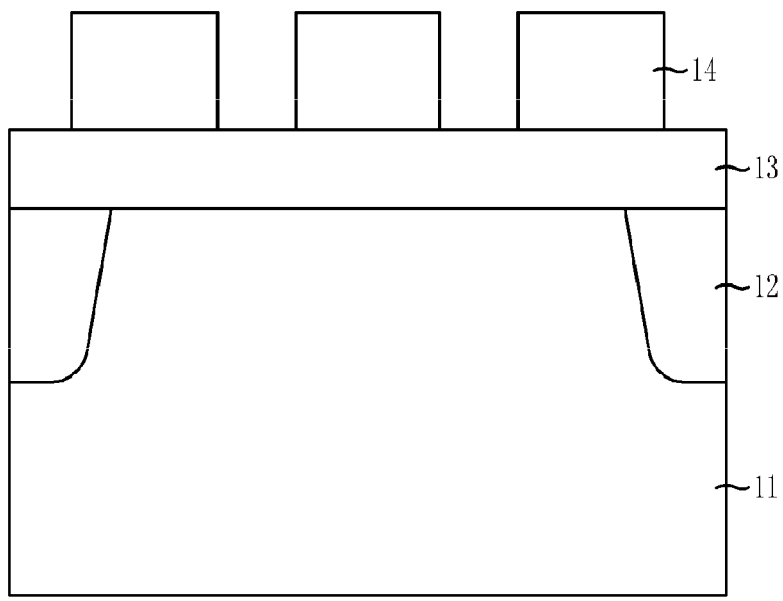
FIGS. 1A to 1E illustrate cross-sectional views of a typical method for fabricating a semiconductor device including a recess gate.
Figure 1B:
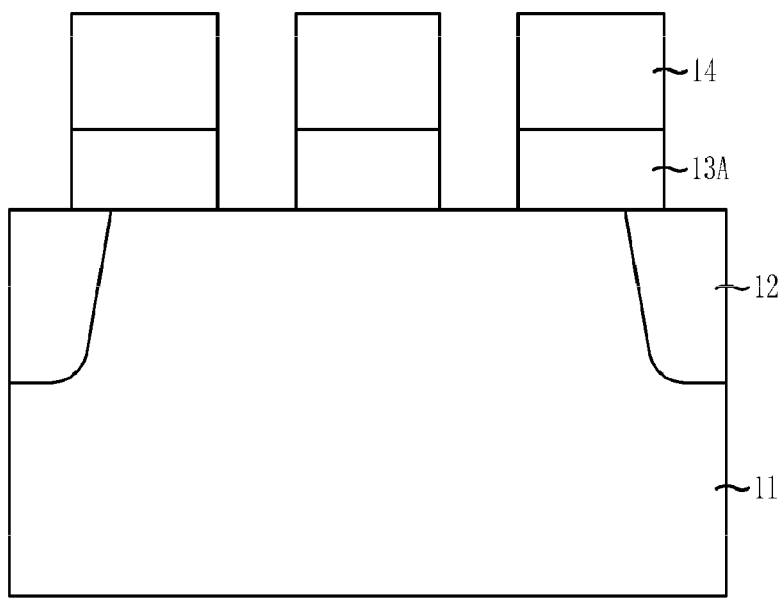
Figure 1C:
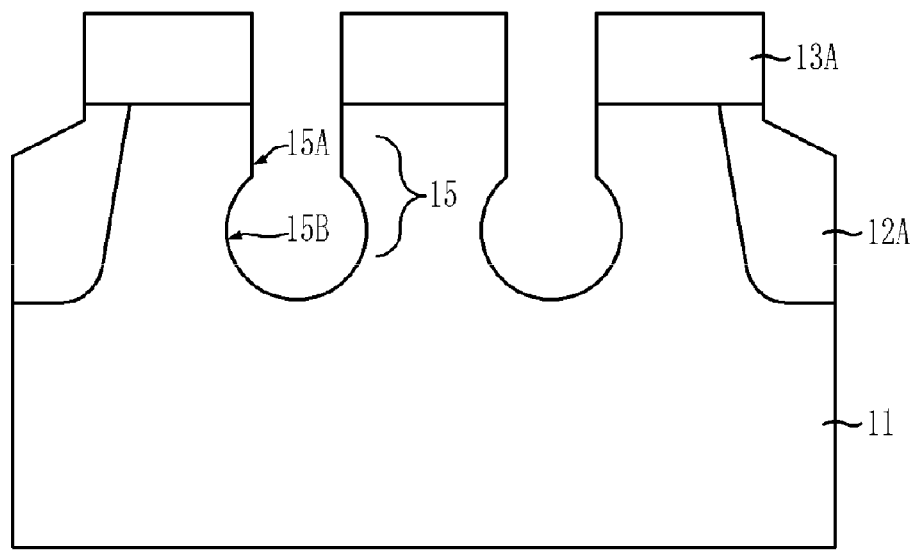
Figure 1D:
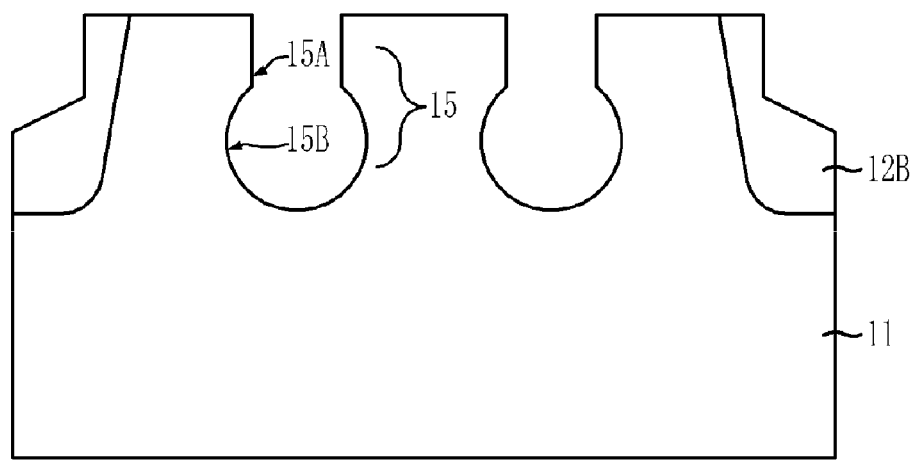
Figure 1E:
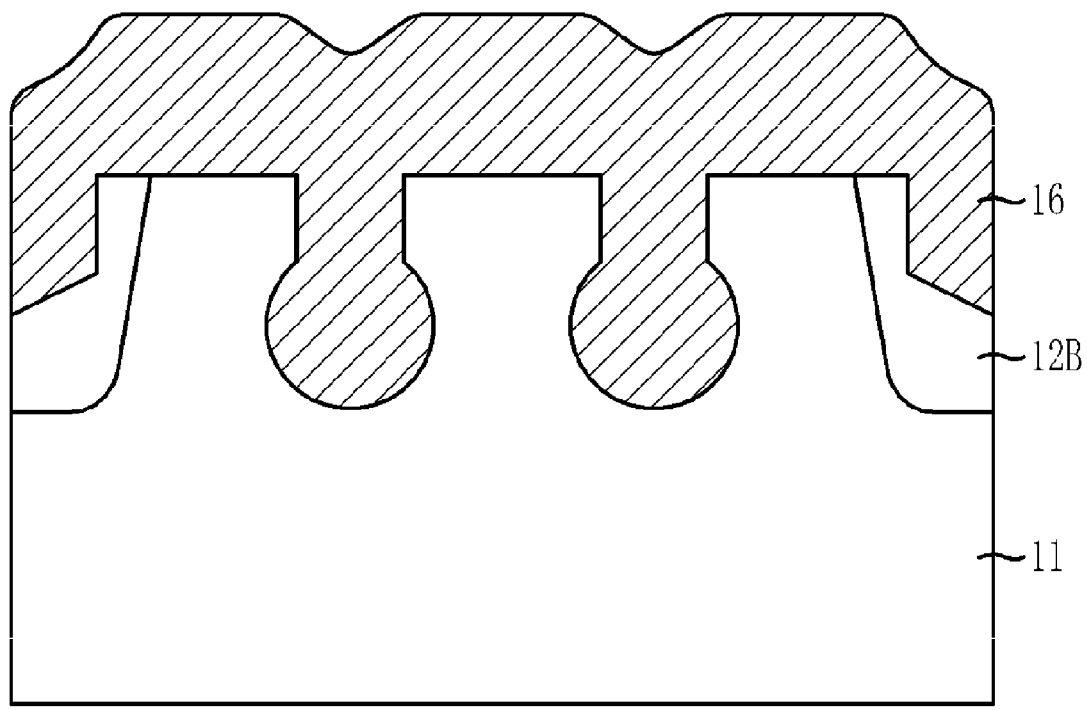
Figure 2A:
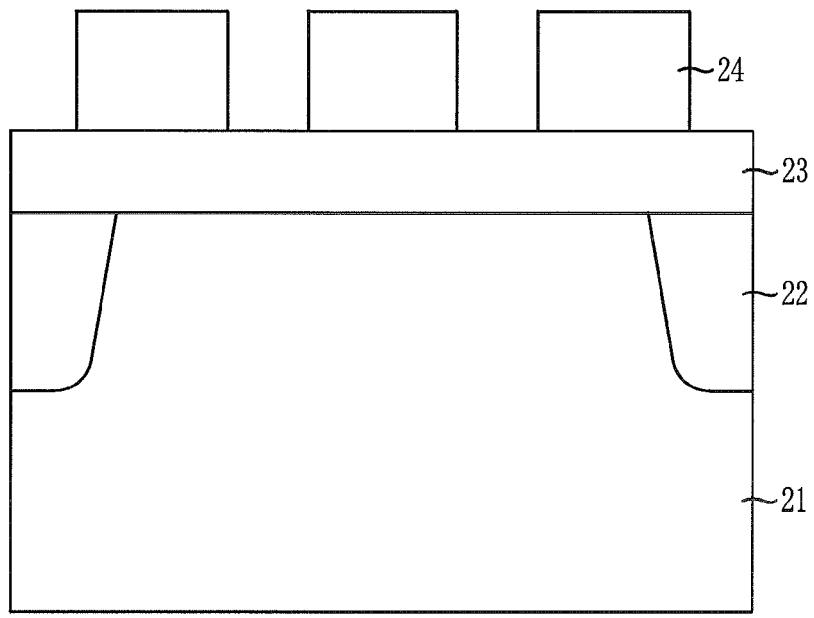
FIGS. 2A to 2F illustrate cross-sectional views of a method for fabricating a semiconductor device including a recess gate according to an embodiment of the present invention.

Referring to FIG. 2A, field oxide layers 22 are formed in a substrate 21. The field oxide layers 22 define an active region and a field region. An oxide-based hard mask 23 is formed over the substrate 21. The oxide-based hard mask 23 functions as a barrier when etching a subsequent recess. The oxide-based hard mask 23 is used as a hard mask because the oxide-based hard mask 23 reduces damage on the substrate 21. According to this embodiment of the present invention, the oxide-based hard mask 23 is not removed by a wet cleaning process (refer to FIG. 2E). Thus, a thickness of the oxide-based hard mask 23 does not have to be minimized as it has in the typical method. For instance, the thickness of the oxide-based hard mask 23 may be approximately 600 Å. A photoresist pattern 24 defining recess regions is formed over the oxide-based hard mask 23.

Figure 2B:
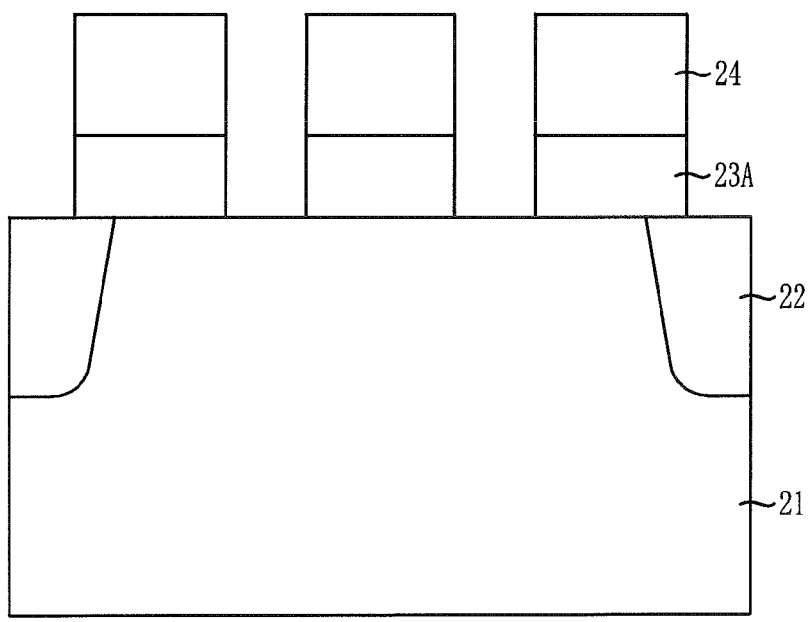

Referring to FIG. 2B, the oxide-based hard mask 23 is etched using the photoresist pattern 24 as a mask. Reference denotation 23A refers to an oxide-based hard mask pattern 23A.

Figure 2C:
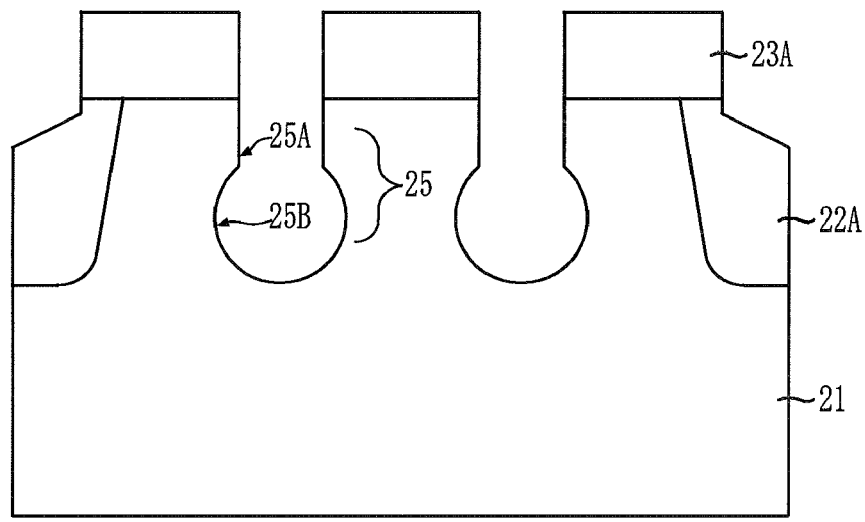

Referring to FIG. 2C, the photoresist pattern 24 is removed. The substrate 21 is then etched using the oxide-based hard mask pattern 23A as a barrier to form recesses 25. In this embodiment of the present invention, the recesses 25 are formed as bulb type recesses as an example. Each recess 25 is configured with an upper portion having a vertical profile and a bottom portion having a rounded profile. The upper portion having the vertical profile may be referred to as a neck pattern 25A and the bottom portion having the rounded profile may be referred to as a bulb pattern 25B.

In more detail, the substrate 21 is etched using the oxide-based hard mask pattern 23A as a barrier to form the neck patterns 25A. A spacer insulation layer (not shown) is formed on sidewalls of the neck patterns 25A. Isotropic etch process is performed on portions of the substrate 21 below the neck patterns 25A to form the bulb patterns 25B using the spacer insulation layer as a barrier.

The bulb type recesses 25 are generally formed by performing a dry etch process using an etch gas. The oxide-based hard mask pattern 23A used as a barrier is damaged during the dry etch process. At this time, the field oxide layers 22 are also damaged as the oxide-based hard mask pattern 23A is damaged because the field oxide layers 22 and the oxide-based hard mask pattern 23A include substantially the same material. For instance, approximately 400 Å to approximately 500 Å of the field oxide layers 22 may be lost. Reference denotation 22A refers to remaining field oxide layers 22A.

Figure 2D:
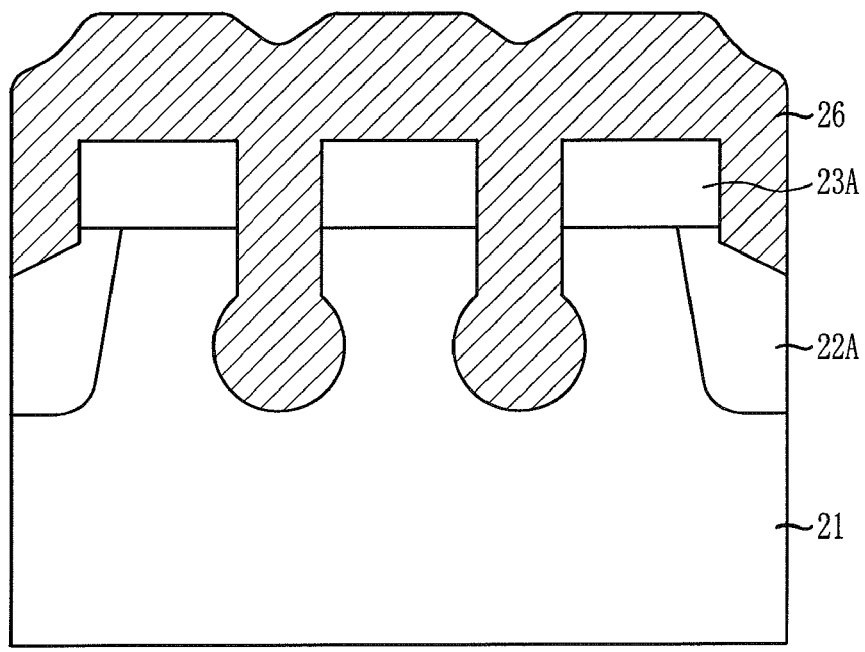

Referring to FIG. 2D, a gate insulation layer (not shown) is formed over the resultant structure. At this time, the oxide-based hard mask pattern 23A is not removed. A first conductive layer 26 is formed over the gate insulation layer. The first conductive layer 26 includes polysilicon. Thus, the first conductive layer 26 is referred to as the first polysilicon layer 26 hereinafter. The first polysilicon layer 26 is formed to a certain thickness which can sufficiently fill the recesses 25. For instance, the thickness of the first polysilicon layer 26 may be approximately 1,000 Å.

Figure 2E:
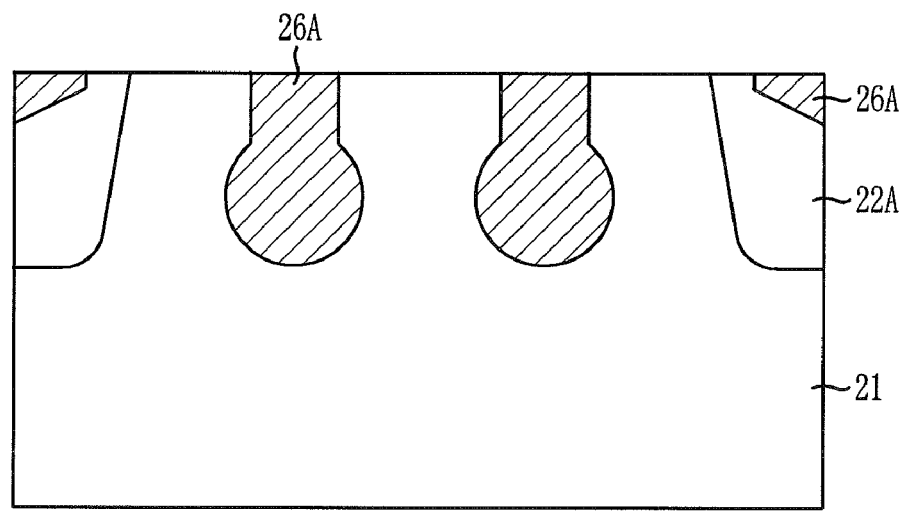

Referring to FIG. 2E, a planarization process is performed on the first polysilicon layer 26 in a manner that portions of the first polysilicon layer 26 remain over the recesses 25 and damaged portions of the remaining field oxide layers 22A. Reference denotation 26A refers to a remaining first polysilicon layer 26A. For instance, the planarization process performed on the first polysilicon layer 26 includes an etch-back process. The etch-back process is performed until the substrate 21 is exposed. At this time, the etch-back process is performed under a selectivity of 1:1 between the first polysilicon layer 26 and the oxide-based hard mask pattern 23A. Thus, the oxide-based hard mask pattern 23A is also etched when the first polysilicon layer 26 is etched. The etch-back process may be performed in a high density plasma etch apparatus using a gas including fluoroform ($CHF_3$) and sulfur hexafluoride ($SF_6$). The etch back process may be performed under an etch condition including a pressure ranging from approximately 3 mtorr to approximately 50 mtorr and a power ranging from approximately 50 W to approximately 400 W. At this time, a flow rate of the gas including $CHF_3$ and $SF_6$ may range from approximately 10 sccm to approximately 100 sccm, and a flow rate ratio of $CHF_3$ to $SF_6$ may be approximately 9:1. Oxygen ($O_2$) having a flow rate ranging from approximately 1 sccm to approximately 10 sccm may be added to the gas including $CHF_3$ and $SF_6$. The high density plasma etch apparatus may be an inductively coupled plasma (ICP) type etch apparatus, a decoupled plasma source (DPS) type etch apparatus, an electron-cyclotron resonance (ECR) type etch apparatus, or magnetically enhanced reactive ion etching (MERIE) type etch apparatus.

According to this embodiment of the present invention, the field oxide layers 22 are damaged when forming the recesses 25 (refer to FIG. 2C). However, the remaining field oxide layers 22A are not further damaged because the oxide-based hard mask pattern 23A is removed by the etch-back process of the first polysilicon layer 26 instead of a wet cleaning process (refer to FIGS. 2D and 2E). That is, the field oxide layers 22 are damaged while forming the recesses 25 mostly. Thus, the damage of the field oxide layers 22 is minimized.

Figure 2F:
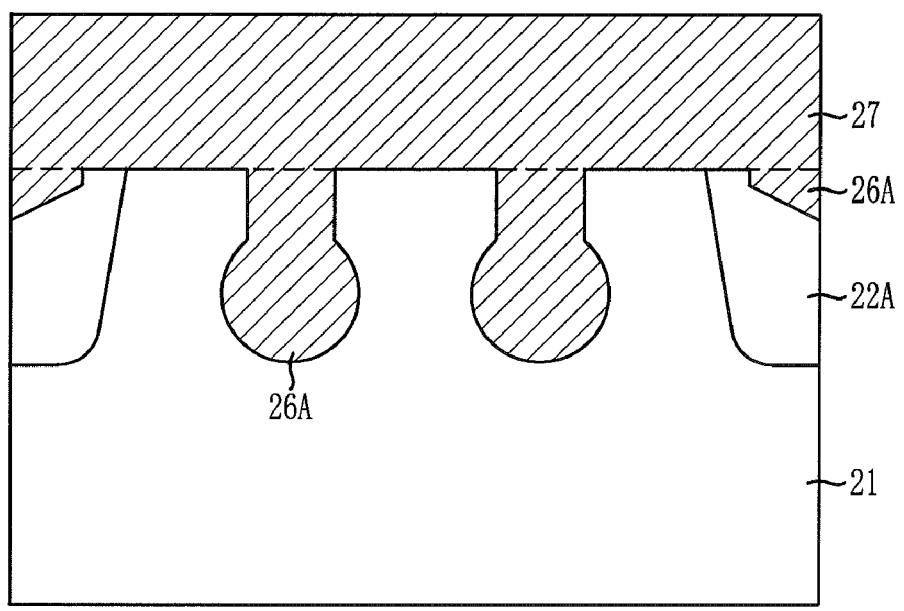

Referring to FIG. 2F, a gate insulation layer (not shown) is formed over the exposed active region of the substrate 21. A second conductive layer 27 for forming gate patterns is formed over the resultant structure. The second conductive layer 27 includes polysilicon. Thus, the second conductive layer 27 is referred to as the second polysilicon layer 27 hereinafter. Differences in height may not occur at an upper portion of the second polysilicon layer 27 because the second polysilicon layer 27 is formed over the planarized remaining first polysilicon layer 26A. That is, a height difference effect generated from the recesses 25 and the damaged portions of the remaining field oxide layers 22A is removed.

Although not shown, subsequent processes include forming a metal layer or a metal silicide layer and a gate hard mask over the second polysilicon layer 27, and selectively etching the gate hard mask, the metal layer or the metal silicide layer, the remaining first polysilicon layer 26A, and the second polysilicon layer 27 to form gate patterns.

Figure 3A:
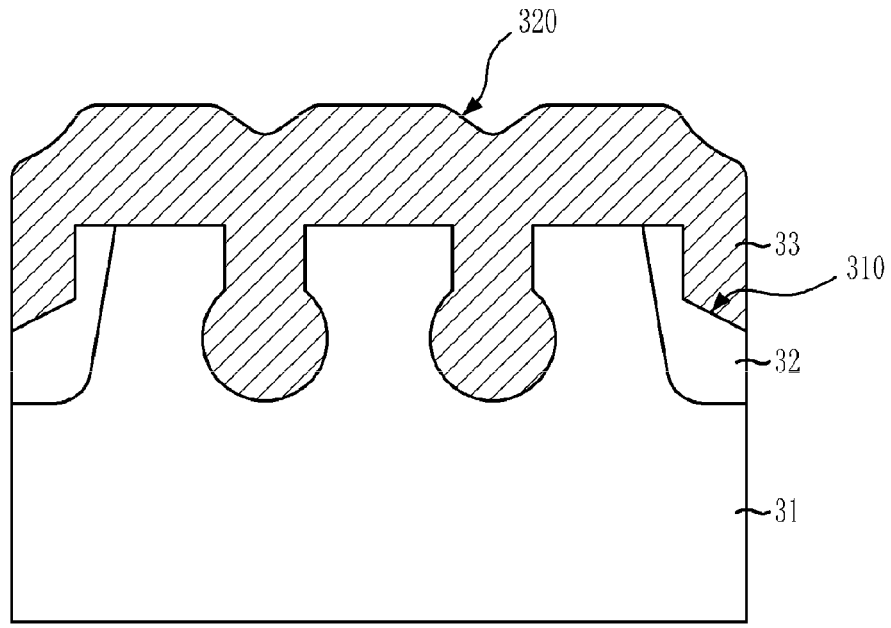
FIGS. 3A and 3B illustrate cross-sectional views of a typical semiconductor device and a semiconductor device according to an embodiment of the present invention.
Figure 3B:
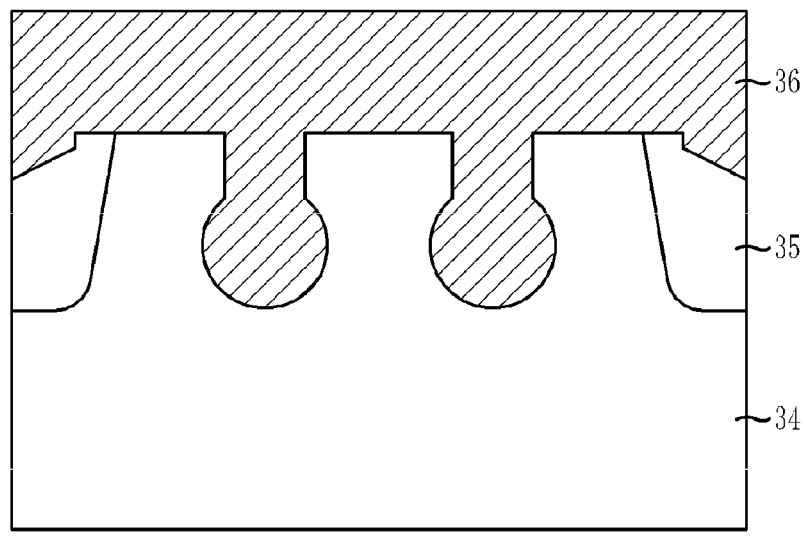

FIGS. 3A and 3B illustrate cross-sectional views of a typical semiconductor device and a semiconductor device according to an embodiment of the present invention.

Referring to FIG. 3A, the typical semiconductor device shows two major limitations. That is, field oxide layers 32 show excessive damages 310, and height differences 320 occur at an upper surface of a polysilicon layer 33 for forming gate patterns. Reference numeral 31 refers to a substrate 31.

Referring to FIG. 3B in contrast, field oxide layers 35 are less damaged in the semiconductor device according to the embodiment of the present invention when compared to the typical semiconductor device shown in FIG. 3A. Also, an upper surface of a polysilicon layer 36 for forming gate patterns is planarized and thus height differences may not occur, overcoming the limitations of the typical semiconductor device. Reference numeral 34 refers to a substrate 34.

According to the embodiments of the present invention, the excessive damage of the field oxide layers and the height difference at the upper portion of the conductive layer for forming gates are reduced by planarizing the conductive layer after formation and forming another conductive layer. Thus, device characteristics may be improved.

While the present invention has been described with respect to the specific embodiments, it will be apparent to those skilled in the art that various changes and modifications may be made without departing from the spirit and scope of the invention as defined in the following claims.

What is claimed is:

1. A method for fabricating a semiconductor device, the method comprising:
   forming a hard mask pattern over a substrate having a field oxide layer;
   etching the substrate to form a recess by using the hard mask pattern;
   forming a first conductive layer over the recess and the hard mask pattern;
   planarizing the first conductive layer and the hard mask pattern, thereby removing the hard mask pattern and a portion of the first conductive layer formed over a surface of the substrate and remaining another portion of the first conductive layer over a damaged portion of the remaining field oxide layer; and
   forming a second conductive layer over the planarized first conductive layer,
   wherein the damaged portion of the field oxide layer is generated during forming of the recess.

2. The method of claim 1, wherein the hard mask pattern comprises an oxide-based layer.

3. The method of claim 1, wherein the first and second conductive layers comprise a polysilicon layer.

4. The method of claim 3, wherein a thickness of the first conductive layer is 1,000 Å.

5. The method of claim 1, wherein planarizing the first conductive layer comprises performing an etch-back process.

6. The method of claim 5, wherein the etch-back process is performed until the substrate is exposed.

7. The method of claim 5, wherein the hard mask pattern comprises an oxide-based layer and the first conductive layer comprises a polysilicon layer, and wherein performing the etch-back process comprises using an etch selectivity of approximately 1:1 between the polysilicon layer and the oxide-based layer.

8. The method of claim 7, wherein performing the etch-back process comprises using a gas including fluoroform ($CHF_3$) and sulfur hexafluoride ($SF_6$).

9. The method of claim 8, wherein a flow rate of the gas ranges from approximately 10 sccm to approximately 100 sccm and a flow rate ratio of $CHF_3$ to $SF_6$ is approximately 9:1.

10. The method of claim 9, wherein oxygen ($O_2$) flowing at a rate ranging from approximately 1 sccm to approximately 10 sccm is added to the gas.

11. The method of claim 8, wherein performing the etch-back process comprises using a pressure ranging from approximately 3 mtorr to approximately 50 mtorr and a power ranging from approximately 50 W to approximately 400 W.

12. The method of claim 5, wherein the etch-back process is performed in a high density plasma etch apparatus.

13. The method of claim 1, further comprising performing a dry etch process using an etch gas.

14. The method of claim 13, wherein the recess comprises a round bottom portion connecting a vertical neck portion.

15. A method for fabricating a semiconductor device, the method comprising:
   forming a hard mask pattern over a substrate having a field oxide layer;
   etching the substrate to form a recess by using the hard mask pattern;
   forming a first conductive layer over the recess and the hard mask pattern;
   removing a height difference effect generated from the recess, hard mask pattern and a damaged portion of the field oxide layer by planarizing the first conductive layer; and
   forming a second conductive layer over the planarized first conductive layer,
   wherein the damaged portion of the field oxide layer is generated during forming of the recess.

16. The method of claim 15, wherein the first and second conductive layers comprise a polysilicon layer.

17. The method of claim 15, wherein planarizing the first conductive layer comprises performing an etch-back process.

18. The method of claim 16, wherein a thickness of the first conductive layer is 1,000 Å.

19. The method of claim 17, wherein the etch-back process is performed in a high density plasma etch apparatus.

20. The method of claim 17, wherein the hard mask pattern comprises an oxide-based layer and the first conductive layer comprises a polysilicon layer, and wherein performing the etch-back process comprises using an etch selectivity of approximately 1:1 between the polysilicon layer and the oxide-based layer.

* * * * *